(12) United States Patent
Fujii

(10) Patent No.: US 6,763,332 B1
(45) Date of Patent: Jul. 13, 2004

(54) SYSTEM AND METHOD FOR SELECTING A PROGRAM IN A BROADCAST

(75) Inventor: Kyoichiro Fujii, Tokyo (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/455,906

(22) Filed: Dec. 7, 1999

(30) Foreign Application Priority Data

Dec. 22, 1998 (JP) ............................................ 10-364730
Jun. 11, 1999 (JP) ............................................ 11-165650

(51) Int. Cl.[7] .............................................. G10L 15/00

(52) U.S. Cl. ...................................... 704/275; 704/246

(58) Field of Search ................................ 704/246, 251, 704/275, 272, 71, 276; 248/727, 734

(56) References Cited

U.S. PATENT DOCUMENTS

| | | | | |
|---|---|---|---|---|
| 5,247,580 A | * | 9/1993 | Kimura et al. | 704/275 |
| 5,471,557 A | * | 11/1995 | Chung et al. | 704/232 |
| 5,566,271 A | * | 10/1996 | Tomitsuka et al. | 704/275 |
| 5,585,865 A | * | 12/1996 | Amano et al. | 348/731 |
| 5,621,456 A | * | 4/1997 | Florin et al. | 348/7 |
| 5,774,859 A | * | 6/1998 | Houser et al. | 704/275 |
| 6,075,575 A | * | 6/2000 | Schein et al. | 348/734 |
| 6,130,726 A | * | 10/2000 | Darbee et al. | 348/734 |

* cited by examiner

Primary Examiner—Daniel Abebe
(74) Attorney, Agent, or Firm—Arent Fox

(57) ABSTRACT

A question means is provided for requiring a reply of a user to a question, receiving means is provided for receiving an instruction of the user. A speech recognizer is provided for recognizing the instruction of the user. A program is selected based on the recognized instruction. The instructed and selected program is stored for learning. The instructed program is displayed on a display.

19 Claims, 12 Drawing Sheets

FIG.7

| 1ST CATEGORY ; $\alpha_i$ (00)H~(1F)H | 2ND CATEGORY ; $\beta_j$ (20)H~(4F)H | 3RD CATEGORY ; $\gamma_k$ (50)H~(9F)H | 4TH CATEGORY ; $\delta_m$ (A0)H~(FF)H |
|---|---|---|---|
| SPORTS (00)H | BASEBALL (20)H | LEAGUE 0 (50)H<br>LEAGUE 1 (51)H<br>⋮ | TEAM 0 (A0)H<br>TEAM 1 (A1)H<br>TEAM 2 (A2)H<br>TEAM 3 (A3)H<br>TEAM 4 (A4)H<br>TEAM 5 (A5)H<br>⋮ |
|  | SOCCER (21)H | WORLD CUP (60)H<br>OLIYMPIC (61)H<br>J LEAG (62)H<br>⋮ | TEAM 0 (C0)H<br>TEAM 1 (C1)H<br>⋮ |
|  | TENIS (22)H | ⋮ (70)H ⋮ | ⋮ |
|  | GOLF (23)H | ⋮ (80)H ⋮ | ⋮ |
| ECONOMY (01)H | ⋮ | ⋮ | ⋮ |
| CULTURE (02)H | ⋮ | ⋮ | ⋮ |
| HOBEY (03)H | ⋮ | ⋮ | ⋮ |
| NEWS (04)H | ⋮ | ⋮ | ⋮ |
| ⋮ | ⋮ | ⋮ | ⋮ |

FIG.10

| INPUT CHANGEOVER SWITCH | | OUTPUT CHANGEOVER SWITCH | | FUNCTION |
|---|---|---|---|---|
| CONTACT a | CONTACT b | CONTACT c | CONTACT d | |
| ○ | × | ○ | | REMOTE CONTROLLER INPUT/ REMOTE CONTROLLER OUTPUT |
| ○ | × | × | ○ | REMOTE CONTROLLER INPUT/ SYNTHESIZER SOUND OUTOUT |
| × | ○ | ○ | × | SOUND INPUT/ REMOTE CONTROLLER OUTPUT |
| × | ○ | × | ○ | SOUND INPUT/ SYNTHESIZER SOUND OUTOUT |

○ : ON
× : OFF

SYSTEM AND METHOD FOR SELECTING A PROGRAM IN A BROADCAST

BACKGROUND OF THE INVENTION

The present invention relates to a system for selecting a program of a broadcast, for example a television broadcast.

Heretofore, a program reservation system as a program selection system disclosed in a Japanese Patent Application Laid Open 9-322085 is known. The program reservation system is mounted in a television receiver and provided to reserve a program instructed by a user based on the speech recognition of the voice emitted by the user.

The television signal includes program guide information data such as by the multiprocessing. The program reservation system stores names of programs, categories of the programs, broadcasting stations, broadcast time, and others in a memory.

These data are divided into upper rank categories and lower rank categories which are included in the upper categories. The user instructs a desired category by speech. In response to the instruction, the program reservation system reads the category from the memory and displays the data on a display. The user selects a desired data from the display by speech, so that a desired program is reserved in accordance with selected contents.

More specifically, the upper categories such as news, amusement, sports, hobby and culture are displayed. If the hobby and culture is selected, lower categories of the hobby and culture such as fine art, game of go and shogi, cooking, health, and others are displayed. When the fine art is selected, programs relative to the fine art are searched from the memory, and a desired program, the channel of the broadcasting station and broadcast time are reserved. At the broadcast time, the selected program of the fine art is tuned and displayed.

The program data are filed and managed in a simple tree diagram as shown in FIG. 12. Namely, there is employed the file structure wherein data for reserving a program are divided into predetermined fixed upper categories and fixed lower categories and stored, and display contents are sequentially opened from the upper categories to the lower categories, thereby reaching a desired program.

Therefore, even if the user wants to directly select a program included in a lower category, a content of upper conception must be selected from an upper category. Thereafter, the lower category to which the desired program belongs, which causes troublesome operation in particular in the case there is many steps before the end.

Furthermore, in the conventional program reservation system, categories are set in accordance with items determined by the above described program guide information, and programs are sorted based on the categories. As a result, the programs are not displayed so as to meet the requirement of the user, so that the user must operate the system in the fixed pattern. Namely the system is not always good in operability.

SUMMARY OF THE INVENTION

An object of the present invention is to provide a program reservation system which enables the user to easily reserve a desired program.

According to the present invention, there is provided a system for selecting a program in a broadcast, comprising, question means for requiring a reply of a user to a question, receiving means for receiving an instruction of the user, recognizing means for recognizing the instruction of the user, selecting means for selecting a program based on the recognized instruction, learning means for storing the instructed and selected program, providing means for providing the instructed program to the user.

The program is a television program, and the providing means is a display of a television receiver.

The system is provided with a remote controller and a remote control signal transmitting and receiving circuit.

The remote controller is provided with an alphabet key for inputting a desired program and a ten key for inputting a channel number.

The present invention further provides a system for selecting a program in a television broadcast, comprising, a display for displaying a question to a user and a television program, receiving means for receiving instruction and reply of the user, recognizing means for recognizing the instruction and reply of the user, displaying means for displaying the instructed program on the display when the instruction is a name of a program, learning means for storing the instructed program.

The display means displays a program on the display when the instruction is stored in the learning means.

The present invention further provides a method for selecting a program in a television broadcast, comprising the steps of, requiring a reply of a user to a question about a program through a display of a television receiver, receiving an instruction of the user in response to the question, recognizing the instruction of the user, selecting a program based on the recognized instruction, storing the instructed and selected program for learning, displaying the instructed program on the display.

BRIEF DESCRIPTION OF DRAWINGS

FIG. 7 shows the data table;

FIG. 10 shows four input/output modes;

DETAILED DESCRIPTION OF THE PREFERRED EMBODIMENT

Figure 1:
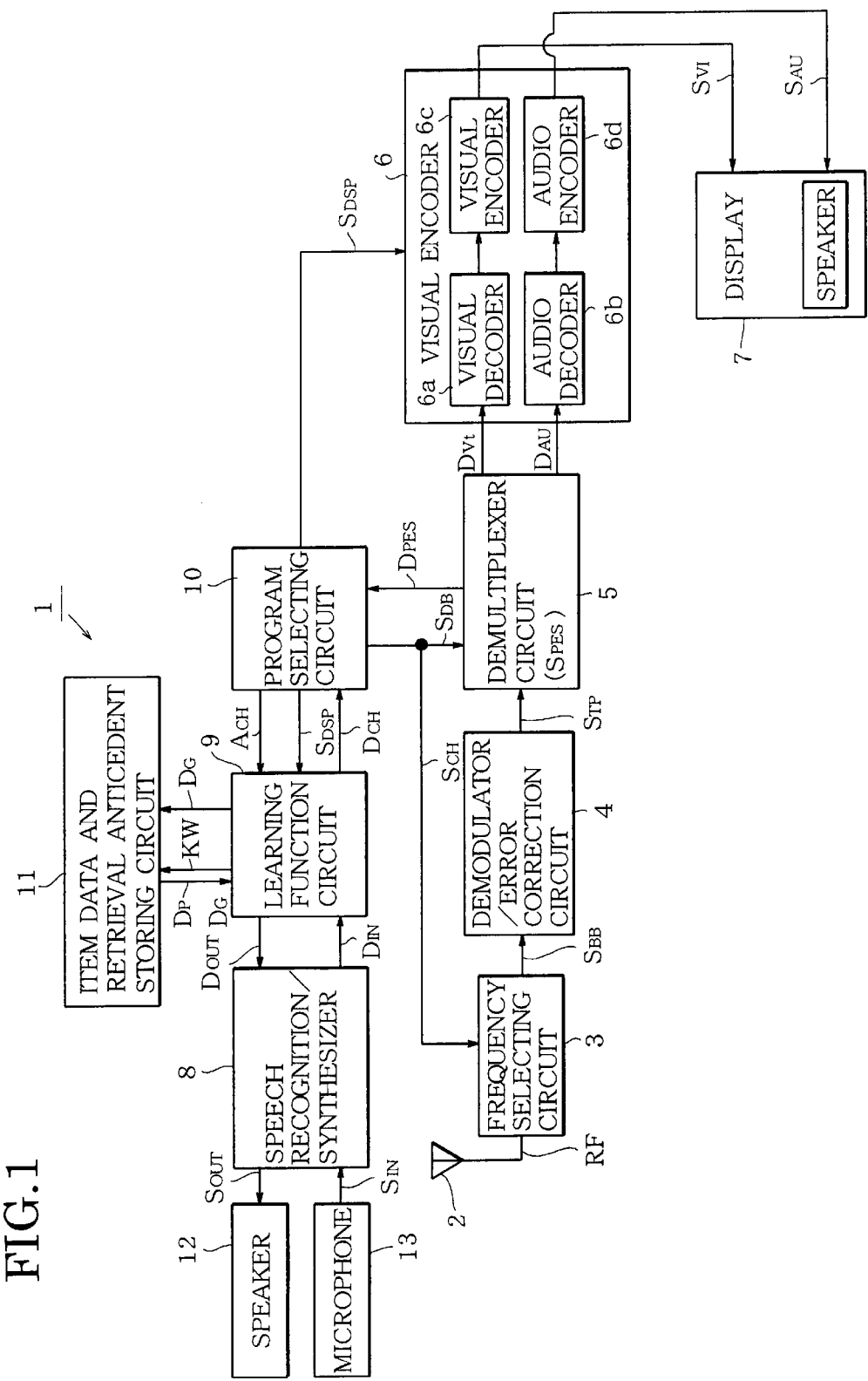
FIG. 1 is a block diagram showing a program selection system 1 of the present invention.

FIG. 1 is a block diagram showing a program selection system 1 of the present invention. The program selection system 1 is provided for extracting program guide data included in a television broadcast signal by the multiprocess and for selecting a broadcast program based on the program guide data as described hereinafter in detail.

The program selection system 1 comprises a frequency selecting circuit 3 in which a television broadcast signal received by an antenna 2 is inputted in a form of an RF signal, a demodulator and error correction circuit 4, a demultiplexer circuit 5, and a visual/audio complexing circuit 6.

The frequency selecting circuit 3 selects a channel instructed by a channel selection signal $S_{CH}$ supplied from a program selecting circuit 10 and produces a base band signal $S_{BB}$ by mixing and frequency-changing the RF signal.

The demodulator and error correction circuit 4 demodulates the base band signal $S_{BB}$ and corrects an error of the signal, thereby producing a transport stream signal $S_{TP}$ based upon MPEG2 (Moving Picture expert Group 2).

The demultiplexer circuit 5 selects a packetized elementary stream signal $S_{PES}$ of a program in a plurality of programs included in the transport stream signal $S_{TP}$ in accordance with the instruction by the program selection signal $S_{DB}$ applied from the program selecting circuit 10. The demultiplexer circuit 5 applies a program guide data $D_{PES}$ included in the packetized elementary stream signal $S_{PES}$ of the selected program to the program selecting circuit 10, and supplies visual and audio packetized elementary stream signals $D_{V1}$ and $D_{AU}$ included in the packetized elementary stream signal $S_{PES}$ to the visual/audio complexing circuit 6 which is called MPEG decoder.

The visual/audio complexing circuit 6 is provided with a visual decoder 6a, audio decoder 6b, visual encoder 6c, and audio encoder 6d. The visual decoder 6a and audio decoder 6b produce a visual signal and an audio signal by the complexing of the packetized element stream signals $D_{V1}$ and $D_{AU}$. The visual encoder 6c produces a visual signal $S_{V1}$ and displayable visual signals from components of R, G, B and Y based on the visual signal. The audio encoder 6d produces an audio signal $S_{AU}$ from the audio signal. The signals $S_{V1}$ and $S_{AU}$ are applied to a display 7 having speaker to reproduce the visual signal and audio signal. Further, the visual/audio complexing circuit 6 adds a display signal $S_{DSP}$ of character information and others supplied from the program selecting circuit 10 to the visual signal $S_{V1}$, thereby displaying the character information and others on the display 7.

The system 1 is further provided with a speech recognition and synthesizer 8, learning function circuit 9, and item data and retrieval antecedent storing circuit 11.

The speech of the user is supplied to the speech recognition and synthesizer 8 from a microphone 13 as an audio signal $S_{IN}$. The speech recognition and synthesizer 8 recognizes the audio signal $S_{IN}$ based on a predetermined algorithm and applies a speech recognition data $D_{IN}$ to the learning function circuit 9 as a recognition result. Furthermore, the speech recognition and synthesizer 8 synthesizes an audio signal $S_{OUT}$ corresponding to an audio data $D_{OUT}$ from the learning function circuit 9. The audio signal $S_{OUT}$ is applied to a speaker 12, thereby emitting as a sound.

Figure 2:
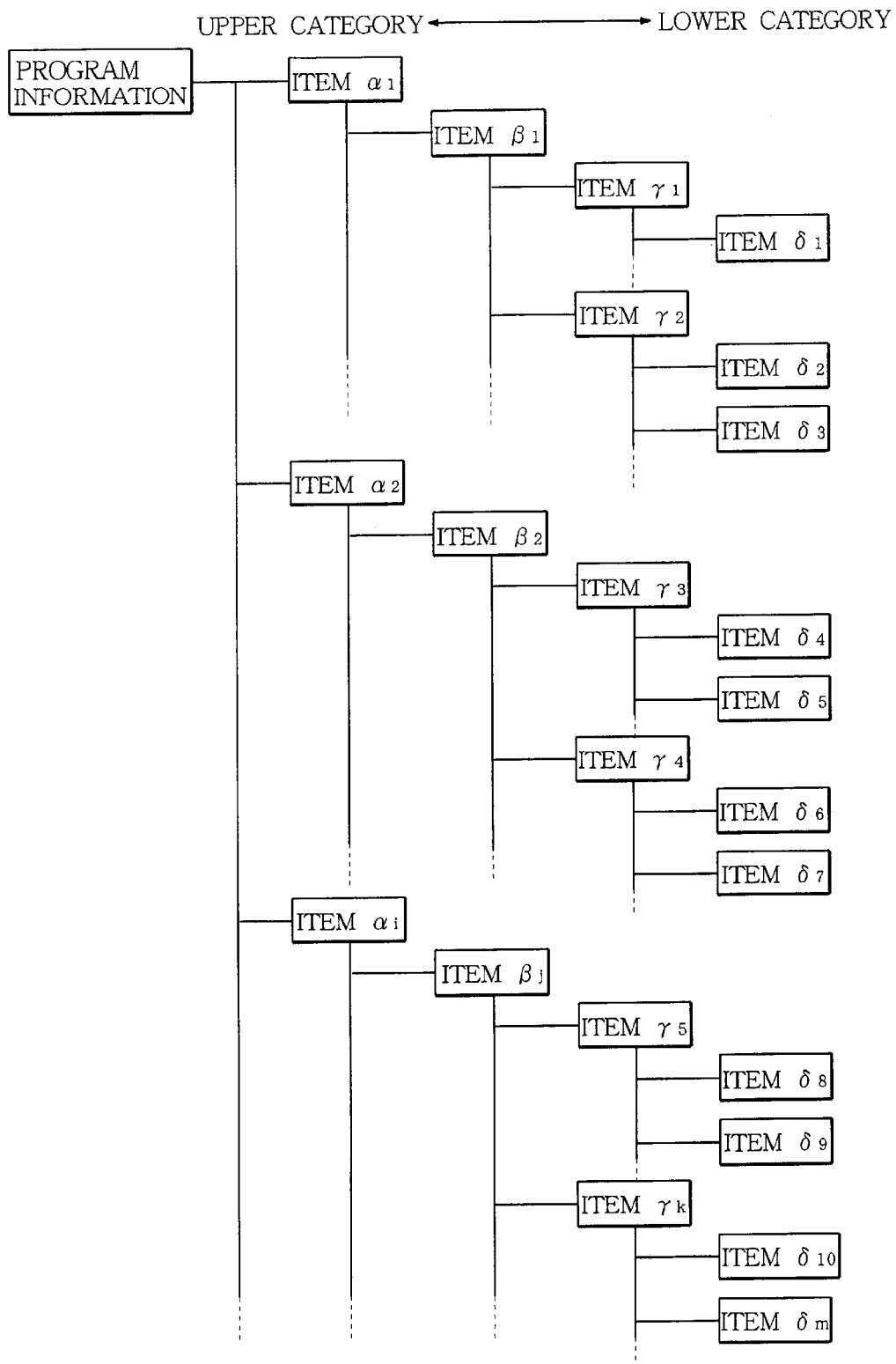
FIG. 2 is a diagram showing a hierarchy of item data

In the item data and retrieval antecedent storing circuit 11, item data representing items for programs are hierarchically arranged as shown in FIG. 2, and stored therein.

There is provided a plurality of items α1 to αi belonging to an upper category.

Each of items β1 to βj belonging to a lower category is subordinately connected to each of Items α1 to αi. In addition, a plurality of subordinate items γ1–γk, δ1–δm are hierarchically connected to the items β1–βj.

The uppermost items α1–αi are used for upper concepts such as "sports", "hobby", "news" and others. As the item β1 subordinate of the sports, an intermediate concept such as "baseball" is assigned. For the item γ1 and the item δ1 for example "National League" and a name of baseball team are assigned.

The learning function circuit 9 is provided with a retrieving function and a learning function. When the user produces a speech of a desired program, the retrieving function operates to retrieve an item data $D_P$ relative to the desired program in accordance with the speech recognition data $D_{IN}$. In order to carry out the retrieval, the learning function circuit 9 extracts a keyword KW included in the speech recognition data $D_{IN}$, and retrieves the item data $D_P$.

For example, in the case that there is only one word identifying a program in the speech recognition data $D_{IN}$, such a speech as "I want to watch a sports program", the learning function circuit retrieves "sports" as a keyword. When there are two words for example "sports" and "baseball", the learning function circuit 9 retrieves the two words as keywords. Based on the keyword, item data are read out from the categories shown in FIG. 2.

Furthermore, the learning function circuit 9 reads out retrieval antecedent data $D_G$ relative to the keywords from the item data and retrieval antecedent storing circuit 11.

The read-out item data $D_P$ and the retrieval antecedent data $D_G$ are fed to the program selecting circuit 10 as a selection demand data $D_{CH}$.

In response to the selection demand data $D_{CH}$, the program selecting circuit 10 retrieves an item data $D_P$ relative to the retrieval antecedent data $D_G$ from the item data $D_P$ based on ambiguous algorithm, thereby identifying a program desired by the user.

Further, the program selecting circuit 10 produces a channel selection signal $S_{CH}$ of the identified item data $D_P$ and a program selection signal $S_{DB}$ for instructing the program. The channel selection signal $S_{CH}$ is fed to the frequency selection circuit 3, the program selection signal $S_{DB}$ is fed to the demultiplexer circuit 5, and a display signal $S_{DSP}$ having channel and program information is supplied to the visual/audio complexing circuit 6.

Accordingly, the frequency selecting circuit 3 tunes based on the program selection signal $S_{DB}$. The demultiplexer 5 selects the program guide data $D_{PES}$, visual and audio packetized elementary stream signals $D_{V1}$ and $D_{AU}$ from the transport stream signal $S_{TP}$. These data are displayed on the display 7. Thus, the user confirms that a desired program is selected.

The program selecting circuit 10 combines retrieval steps data until a desired program is identified by the ambiguous algorithm in accordance with the selection demand data $D_{CH}$ with the program guide data $D_{PES}$, and produces a program relating data $A_{CH}$ which is fed to the learning function circuit 9.

The learning function circuit 9 adds the program relating data $A_{CH}$ to the retrieval antecedent data $D_G$ stored in the retrieval antecedent circuit 11 to produce a new retrieval antecedent data $D_G$ which is stored in the retrieval antecedent storing circuit 11.

Figure 4:
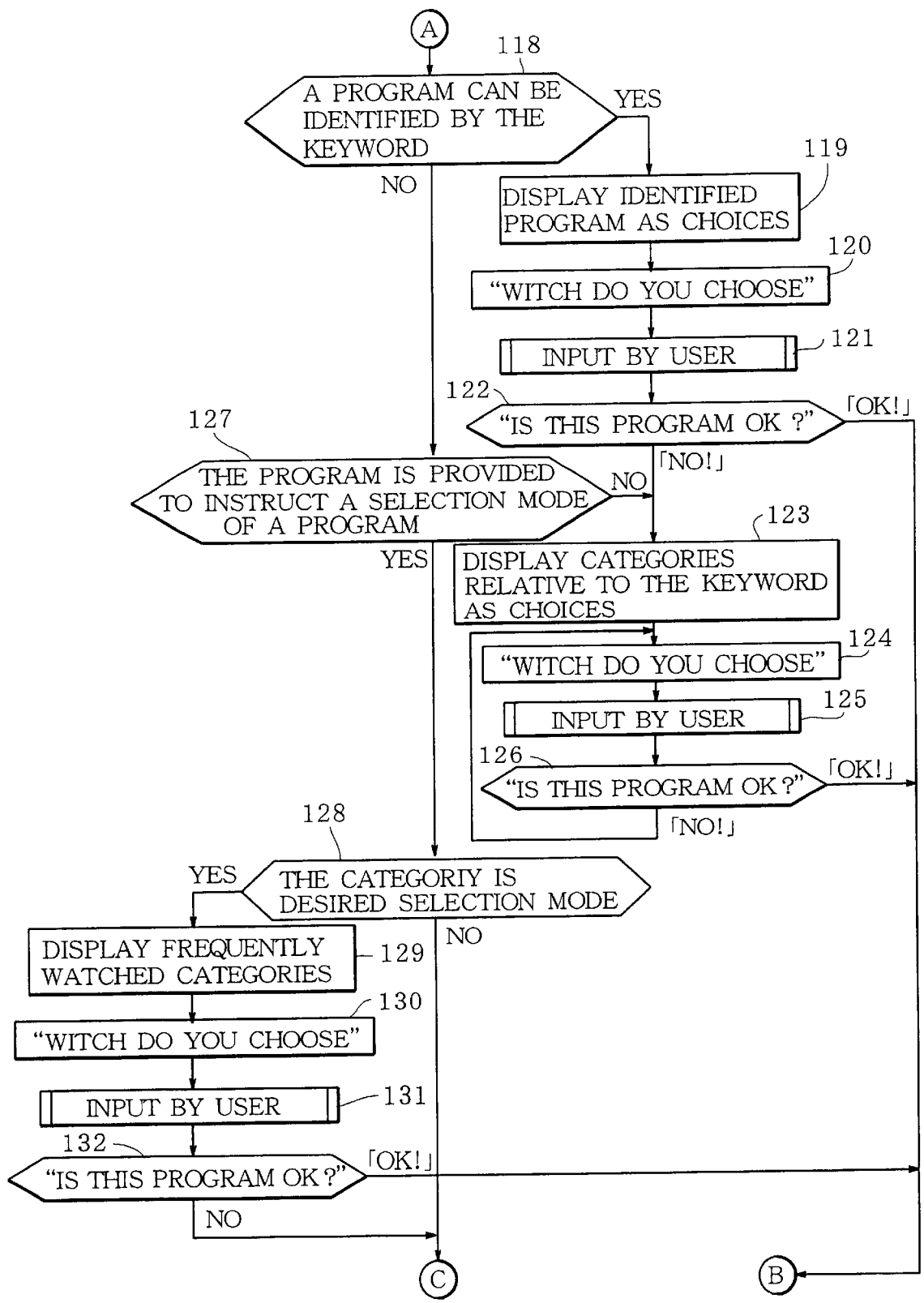
Figure 5:
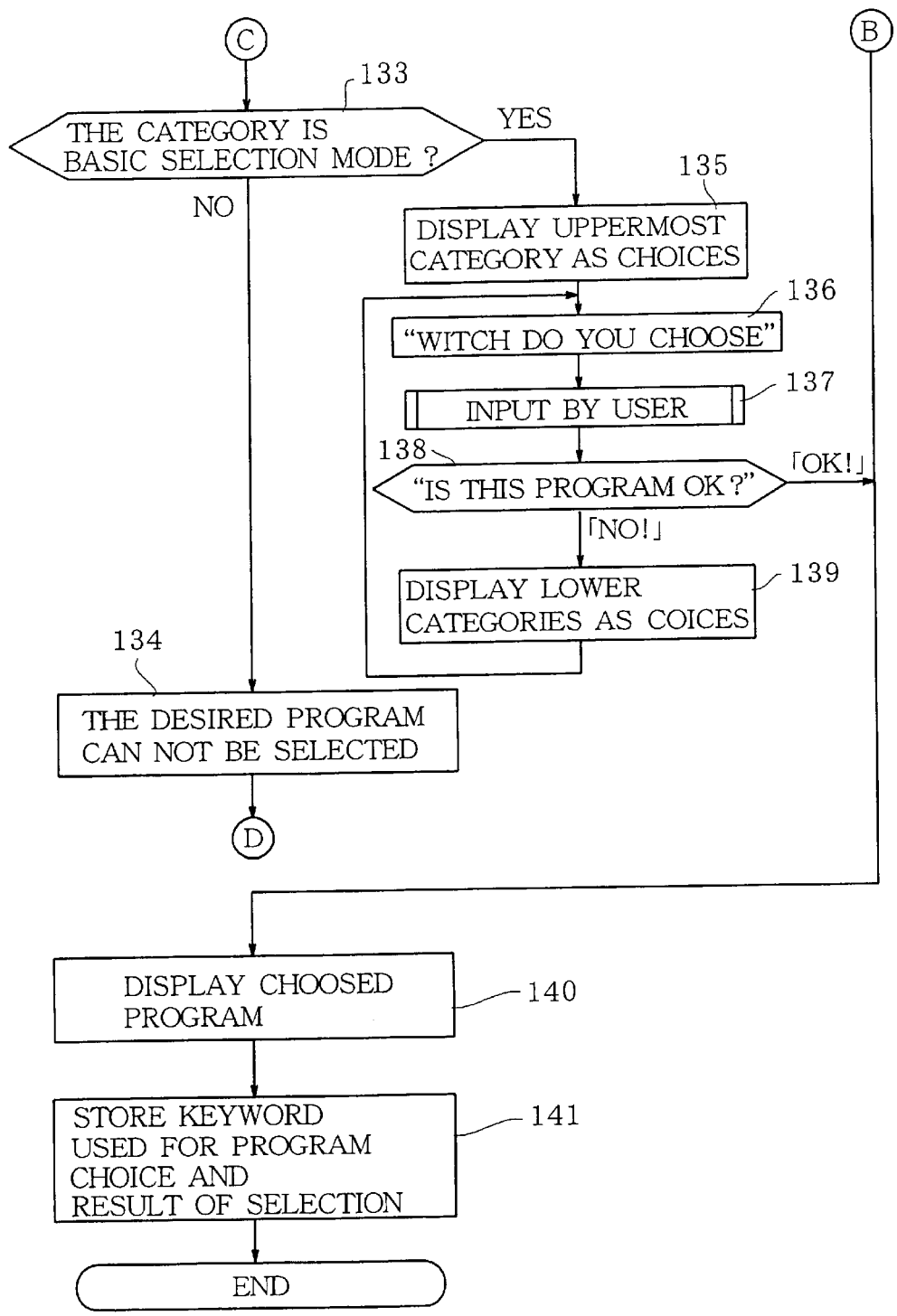

The operation of the system of the present invention will be described with reference to flowcharts of FIG. 3 through FIG. 5.

Figure 3:
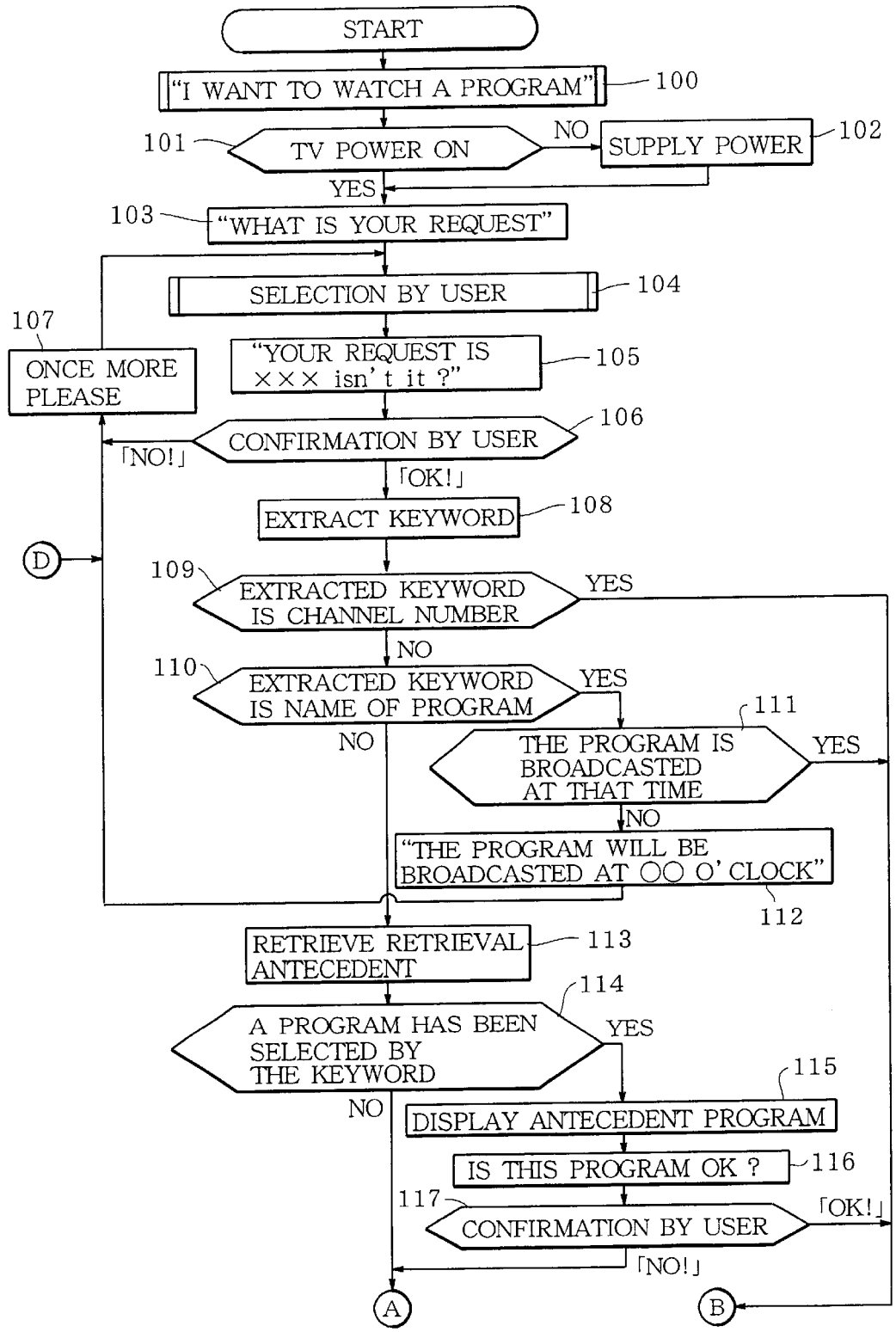
FIGS. 3–5 are flowcharts.

Referring to FIG. 3, the user instructs by utterance, suggesting the selection of a program. For example, when the user utters "I want to watch a television program" (step 100), the speech recognition and synthesizer 8 and the learning function circuit 9 recognize the speech, and determine whether a television power supply switch is turned on (step 101). When the switch is turned on, the speaker 12 emits synthesized sounds so as to make the user speaks a desired program (step 103).

When the power supply switch is not turned on, the switch is turned on by the system (step 102). At the step 103, the speaker 12 asks "what is your request?"

When the user responds, the speech recognition and synthesizer 8 recognizes the response (step 104) and confirms "your request is XXX isn't it?" (step 105).

At a step 106, the user responds. If YES, the program proceeds to a step 108, and if NO, the program goes to a step 107. At the step 107, speaker 12 speaks "once more please".

At the step 108, the learning function circuit 9 extracts a keyword KW included in the speech recognition data $D_{IN}$. At a step 109, it is determined whether the keyword KW is a number of a channel. If YES, the program proceeds to a step 140 of FIG. 5. If NO, it is determined whether the keyword KW is a name of a program at a step 110. If it is the case, the program goes to a step 111, if NO the program goes to a step 113.

At the step 111, it is determined whether the program is broadcasted at that time. If it is not broadcasted, the speaker informs that the program will be broadcasted at ○ ○ o'clock at a step 112 and the program returns to the step 107.

When the keyword KW is not a name of a program, the retrieval antecedent data $D_G$ and the item data $D_P$ are read out from the item data and retrieval antecedent storing circuit 11 (step 113). At a step 114, it is determined whether there is a fact that a program has been selected by the keyword KW. If YES, the name of the antecedent program is displayed on the display 7 (step 115), and the speaker asks "is this program OK?" (step 116). The user responds at a step 117. When NO at the steps 114 and 117, the program proceeds to a step 118 of FIG. 4.

At the step 118, it is determined whether a program can be identified by the keyword KW. If possible, identified programs are displayed as choices (step 119), and the speaker 12 asks "which do you choose?" (step 120). At a step 121, the user inputs a desired program, and the speaker asks "is this program OK?" (step 122).

If NO at the step 118, it is determined whether the keyword is provided to instruct a selection mode of a program (step 127). If NO at the steps 122 and 127, the program goes to a step 123.

At the step 123, categories relative to the keyword are displayed as choices, and speaker asks "which do you choose?" (step 124). At a step 125, the user inputs a desired category, and it is confirmed "is this program OK?" (step 126). The steps 124, 125 and 126 are repeated until OK.

When YES at the step 127, it is determined whether the category is a desired selection mode at a step 128. If NO, the program proceeds to a step 133 of FIG. 5. If YES, frequently watched categories are displayed as choices based on the retrieval antecedent data $D_G$, and the speaker asks "which do you choose?" at a step 130. At a step 131, the user inputs a desired category. At a step 132, the speaker asks "is this program OK?"

When NO at the steps 128 and 132, it is determined whether the category is a basic selection mode (step 133). If NO, the speaker informs that the desired program can not be selected at a step 134, and the program returns to the step 107.

When YES at the step 133, an uppermost category is displayed as choices, and the speaker asks "which do you choose?" at a step 136. The user inputs a desired category at a step 137. The speaker asks "is this program OK?" at a step 138. If OK, the program proceeds to the step 140. If NO, lower categories are displayed as choices (step 139) and the program returns to the step 136.

When OK at the steps 111, 117, 122, 126, 132, and 138 a chosen program is displayed at the step 140. At a step 141, the keyword used for the program choice and the result of the selection are stored in the item data and retrieval antecedent storing circuit 11.

The system of the present invention can be applied to radio broadcasting and multimedia communication networks.

Figure 6:
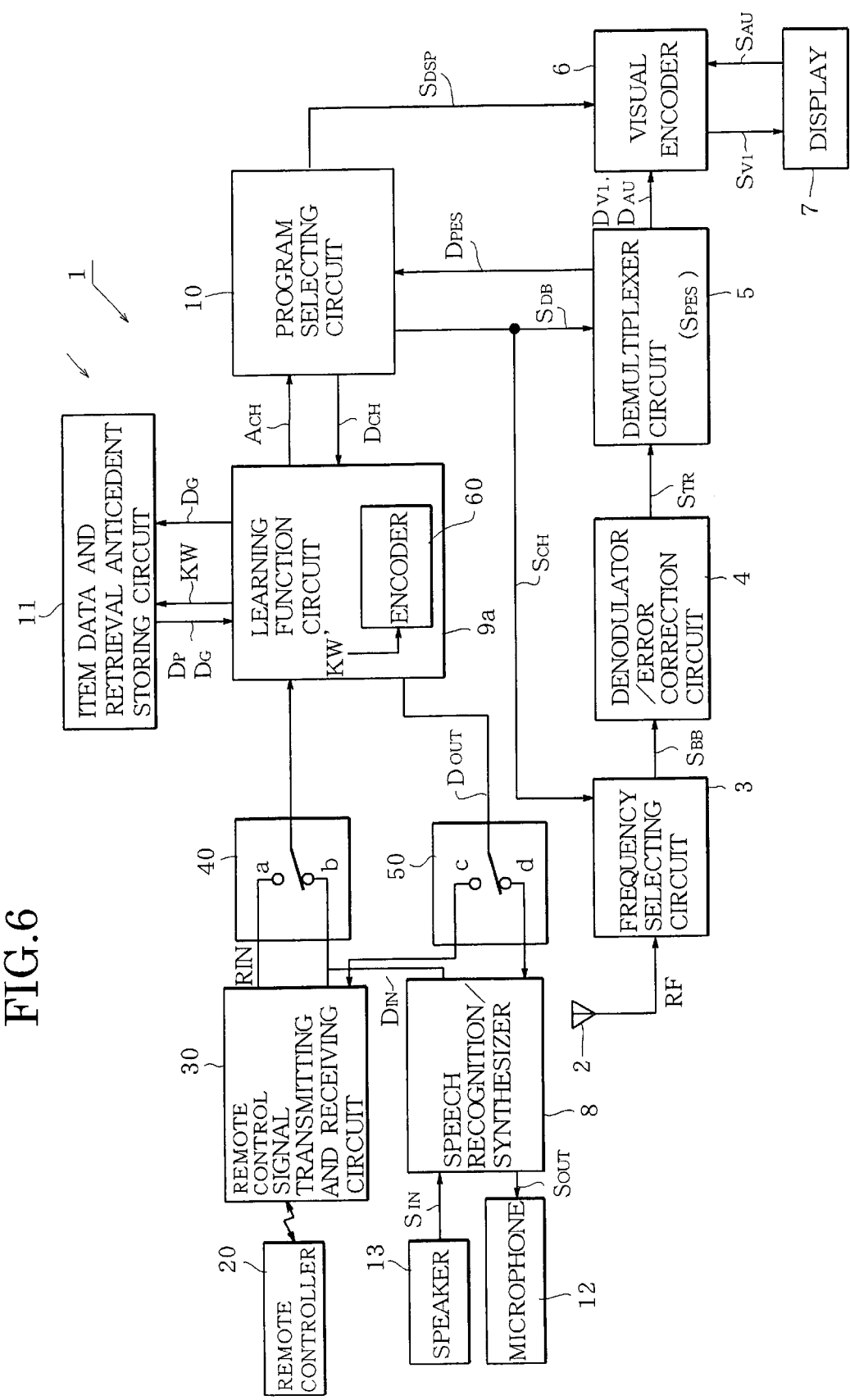
FIG. 6 is a block diagram showing a second embodiment of the present invention.

The second embodiment of the present invention is described with reference to FIGS. 6–11. In FIG. 6, the same parts as FIG. 1 are identified by the same reference numerals as FIG. 1.

The system of the second embodiment is adapted to be operated by a remote controller 20. The system is provided with a remote control signal transmitting and receiving circuit 30, an input changeover switch 40, an output changeover switch 50, and a learning function circuit 9a. The learning function circuit 9a has an encoder 60.

The remote control signal transmitting and receiving circuit 30 is provided with a receiving circuit for demodulating a light signal from the remote controller 20 and for producing a received data $R_{IN}$ and with a transmitting circuit for modulating the audio data $D_{OUT}$ supplied from the learning function circuit 9a through the changeover switch 50 and for transmitting the modulated light signal to the remote controller 20.

The input changeover switch 40 has a fixed contact a connected to an output of the receiving circuit of the remote control signal transmitting and receiving circuit 30, and a fixed contact b connected to an output of the speech recognition and synthesizer 8.

The output changeover switch 50 has a fixed contact c connected to an input of the remote control signal transmitting and receiving circuit 30, and a fixed contact d connected to an input of the speech recognition and synthesizer 8.

The movable contacts of the switches 40 and 50 are operated by the remote control signal transmitting and receiving circuit 30.

When the speech recognition data $D_{IN}$ is fed to the learning function circuit 9a through switch 40, the learning function circuit 9a extracts a keyword KW' included in the speech recognition data $D_{IN}$, and the keyword KW' is supplied to the encoder 60.

The encoder 60 reads a code data corresponding to the keyword KW' with reference to a data table provided in the retrieval antecedent circuit 11, and converts the keyword KW' to a keyword KW. The keyword is processed by the program of FIGS. 3–5.

When the received data $R_{IN}$ is fed to the learning circuit 9a through the switch 40, the received data $R_{IN}$ is supplied to the encoder 60.

The encoder 60 reads a code data corresponding to the receiving data $R_{IN}$ with reference to a data table provided in the retrieval antecedent circuit 11, and converts the read out code data to a keyword KW. The keyword is processed by the program of FIGS. 3–5.

FIG. 7 shows the data table in the retrieval antecedent circuit 11. In the data table, keywords KW' (word) and code data are stored.

The encoder 60 changes the word keyword KW' to the keyword KW in the form of the code data by reading the code data.

For example, when the user speaks "sports", a keyword KW' of "Sports" (word) is extracted from the speech recognition data $D_{IN}$, a code data (00)H belonging to the first category al is changed to a key word KW. When the user speaks "baseball", a code data (20)H belonging to the second category β1 is converted to a keyword KW corresponding to baseball. Other keywords KW' are converted to keywords KW of code data.

Figure 8:
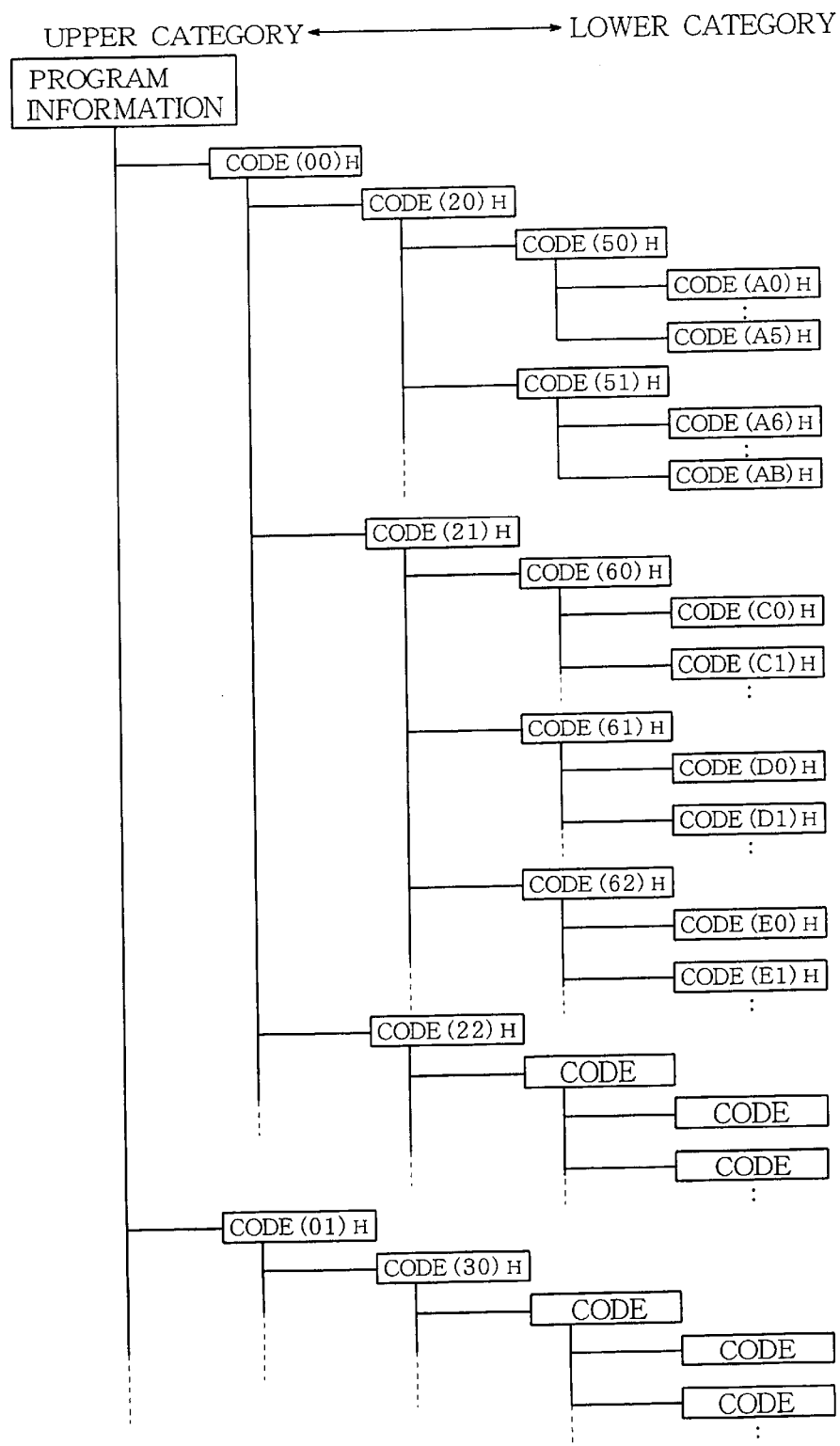
FIG. 8 is the data table of FIG. 7.

The data table of FIG. 7 is hierarchically composed as shown in FIG. 8.

The learning function circuit 9 identifies a program based on the hierarchized item data (code data). Namely, the data table has two functions. One of the functions is a reference data storing means which is used at a time when the encoder 60 converts the keyword KW' to the keyword KW, and the other is a reference data storing means which is used by the learning circuit 9a at retrieving and learning a program. As a result, the storing capacity is reduced.

Furthermore, when the user speaks "team 1" of the team name belonging to the lowermost category, the learning function circuit 9 retrieves a retrieval antecedent data $D_G$ and item data $D_P$, supplies both data to the program selecting circuit 10 as the selection demand data $D_{CH}$. The selection demand data $D_{CH}$ is represented as (00 20 50 A1) in accordance with the code data of FIG. 7. Since the item data $D_P$ representing the program information is represented and managed by the code data, it is possible to process a large number of sets of information by a small number of bits. The system is miniaturized and the retrieval can be processed at a high speed.

When the program guide data $D_{PES}$ is applied to the program selecting circuit 10, and learning circuit 9a adds a new item data $D_P$ to the data table in the retrieval antecedent storing circuit 11 in accordance with the program guide data $D_{PES}$, the encoder 60 converts the program guide data $D_{PES}$ to the item data $D_P$. Consequently, the program retrieval based on the added new item data can be processed at a high speed.

The operation of the system of FIG. 6 is described hereinafter.

Figure 9:
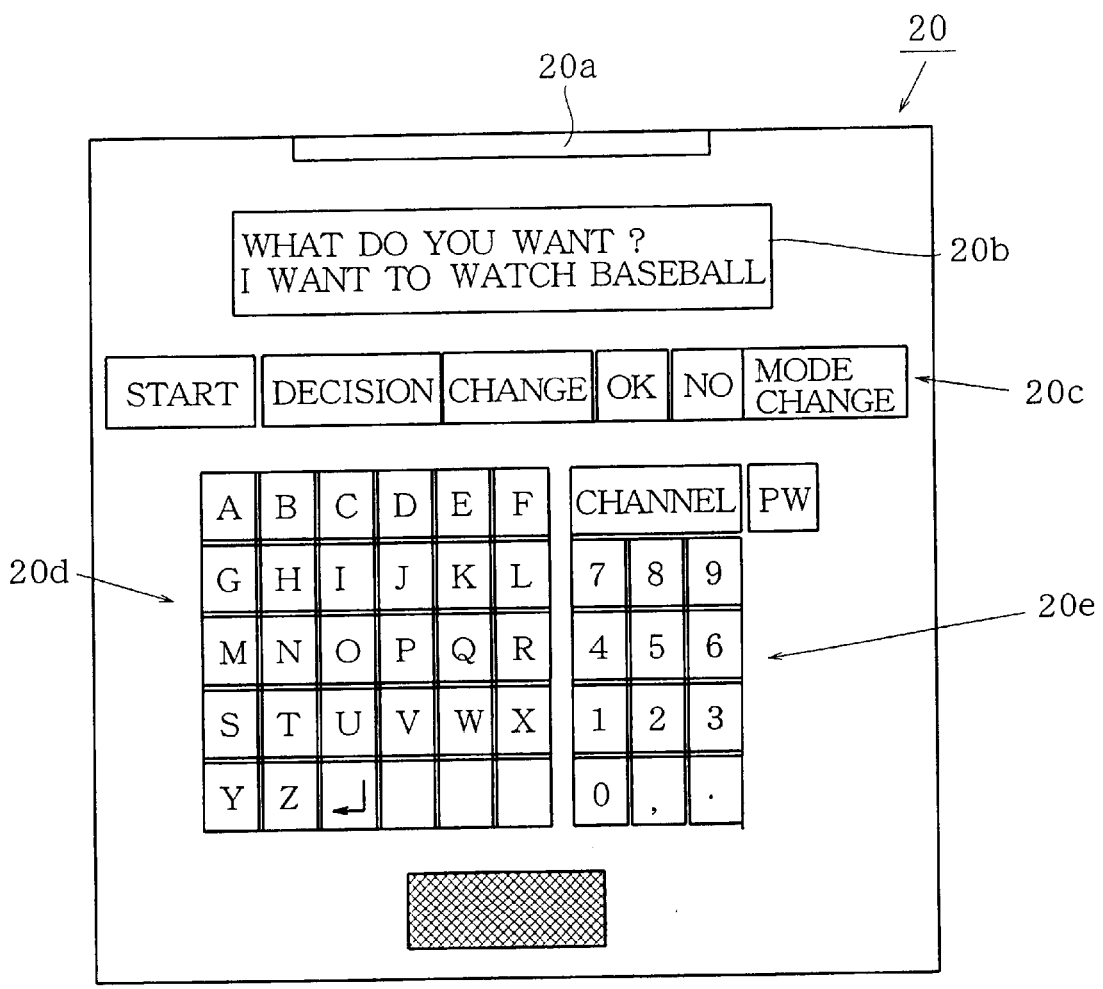
FIG. 9 is a plan view of a remote controller.

As shown in FIG. 9, the remote controller 20 has a transmitter-receiver section 20a, display 20b, function key 20c, alphabet key 20d, ten key 20e, and others.

When the user depresses the key of "Mode Change", one of four input/output modes shown in FIG. 10 is changed at every depression.

For example, when the key is depressed one time, the uppermost first mode is selected. Namely, the contact a of the switch 40 is closed, and contact c of the switch 50 is closed. Thus, input and output operations of the remote controller 20 can be performed.

When the start key is depressed in the first mode, an input instruction is given to the learning function circuit 9a. In response to the instruction, the learning function circuit 9a produces the audio data $D_{OUT}$ corresponding to "what do you want?" The audio data $D_{OUT}$ is transmitted to the remote controller 20 from the remote control signal transmitting and receiving circuit 30, so that "what do you want?" is displayed on the display 20b.

The user inputs "I want to watch baseball." by the alphabet key 20d, and depresses Decision key. The learning circuit 9a retrieves a keyword KW' of baseball, and retrieves a program based on the keyword KW of the code data (00)H corresponding to the keyword KW'.

When the user wants to change the input content, Change key is depressed, and alphabet keys are depressed to input a new content.

When Channel key is depressed and the ten key is depressed, a channel of a broadcast station can be directly instructed.

For example, when "is this program OK?" (same as step 116 of FIG. 3) is displayed on the display 20b, the user depresses OK or NO key.

When the Mode Change key is depressed again (two times), the second input/output mode of FIG. 10 is selected. In the second mode, the contact a and contact d are closed. Therefore, the output is carried out from the speaker 12.

When the Mode Change is depressed once more (3 times), the third mode is selected. In the mode, contact b and contact c are closed. The mode becomes an audio input mode and a remote controller display mode.

In the fourth mode the contact b and contact d are closed. Therefore, the mode becomes the audio input and output modes.

If the Mode Change key is depressed, the mode returns to the first mode.

Figure 11:
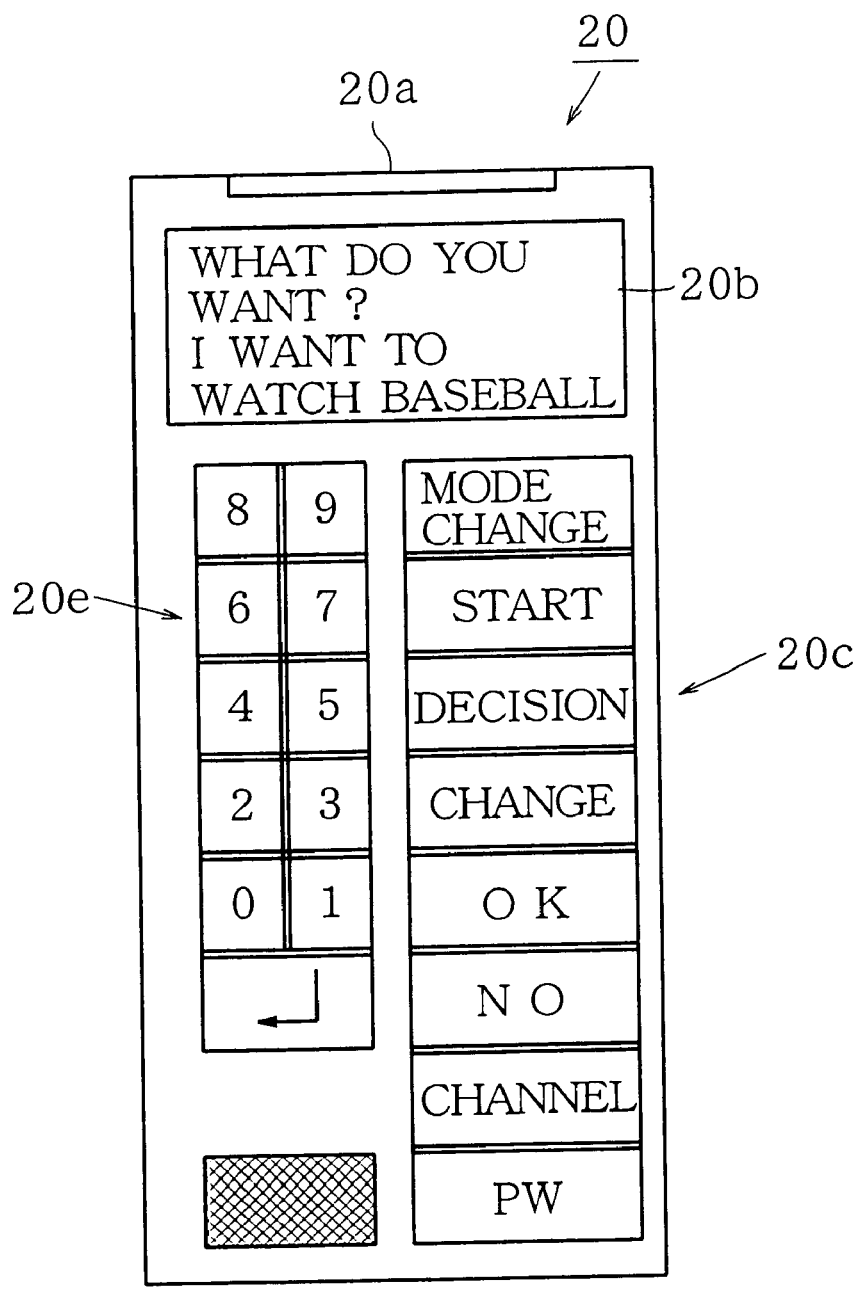
FIG. 11 is a plan view showing another remote controller.
Figure 12:
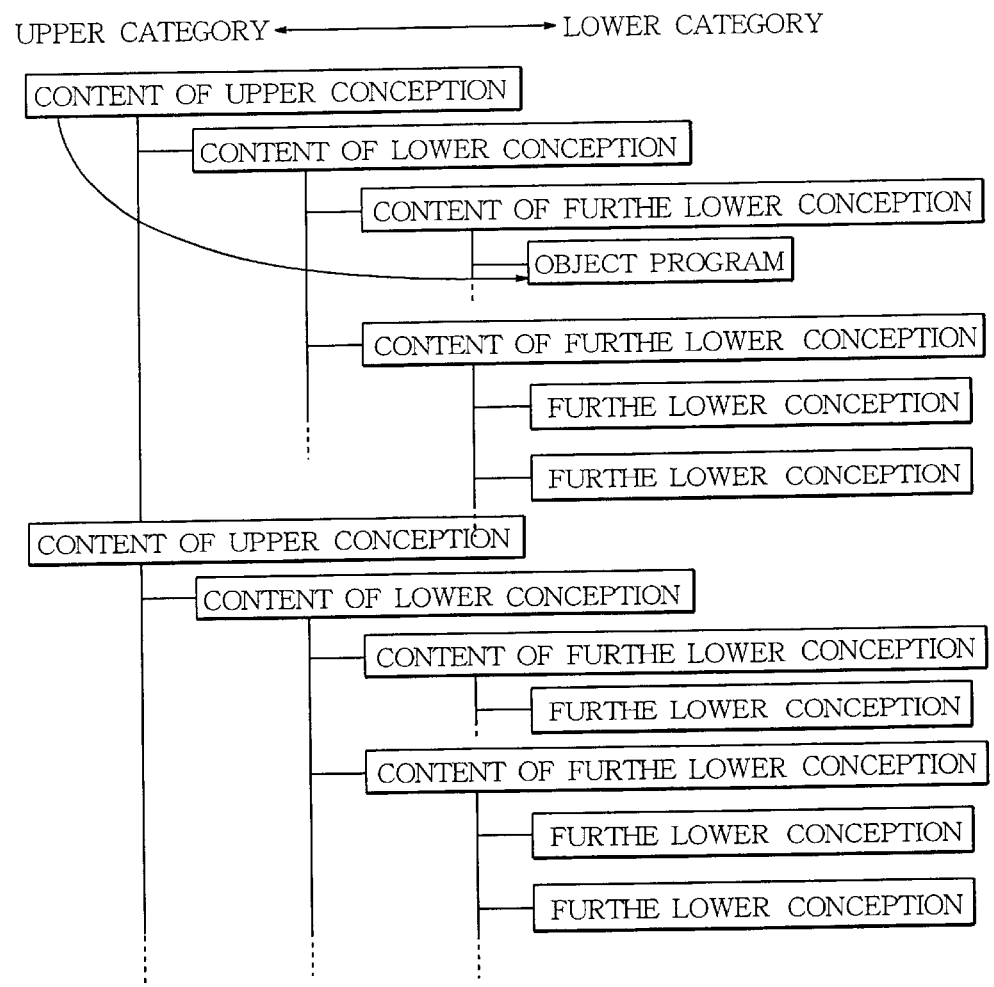
FIG. 12 is a simple tree diagram.

FIG. 11 shows a modification of the remote controller 20. The alphabet key is omitted in the remote controller. Alphabets are assigned to the ten key. For example, "A" "B" "C" are assigned to "0" key, the alphabets are changed from "A" to "C" at every depression of the key.

In accordance with the present invention, if there is a fact that the program instructed by the user has been watched by the user, the program is immediately displayed without passing a plurality of steps. Thus, the user is relieved of troublesome reply.

While the invention has been described in conjunction with preferred specific embodiment thereof, it will be understood that this description is intended to illustrate and not limit the scope of the invention, which is defined by the following claims.

What is claimed is:

1. A program selecting system for receiving broadcast signals including guide information of broadcast programs and selecting a program in a broadcast, comprising:
    a data storing section for storing item data representing items for programs and being classified by category and retrieval history information including a retrieval frequency;
    a question section for requiring an instruction of a user to a question;
    a receiving section for receiving an instruction of the user;
    a recognizing section for recognizing said instruction of the user;
    an extracting section for extracting a keyword from said recognized instruction;
    a program selecting section for selecting an instructed program from said guide information of broadcast programs by retrieving said item data and said retrieval history information based on said extracted keyword;
    a learning section for obtaining retrieval history information when said instructed program is selected and for updating said retrieval history information including said retrieval frequency by adding said obtained retrieval history information to learn a user's favorite with said retrieval frequency; and
    a providing section for providing said instructed and selected program to the user.

2. The system according to claim 1, wherein the program is a television program, and the providing section is a display of a television receiver.

3. The system according to claim 2, wherein the question section includes a speaker.

4. The system according to claim 3, further comprising a speech synthesizer for requesting the reply of the user.

5. The system according to claim 2, wherein the receiving section includes a microphone.

6. The system according to claim 5, further comprising a speech synthesizer and for requesting the reply of the user.

7. The system according to claim 2, further comprising a remote controller and a remote control signal transmitting and receiving circuit.

8. The system according to claim 7, wherein the remote controller has a display.

9. The system according to claim 8, wherein the question is displayed on the display.

10. The system according to claim 8, wherein the remote controller is provided with an alphabet key for inputting a desired program.

11. The system according to claim 8, wherein the remote controller has a numeric keypad for inputting a channel number.

12. The system according to claim 2, wherein the instructed and selected program is displayed on the display when said keyword is a name of a program which is included in the guide information of television programs or in the retrieval history information stored in the data storing section.

13. The system according to claim 2, wherein the instructed and selected program is displayed on the display when said keyword is stored in the data storing means.

14. A method for receiving broadcast signals including guide information of television programs and selecting a program in a television broadcast, comprising the steps of:

requiring an instruction of a user to a question;

receiving said instruction of the user in response to said question;

recognizing said instruction of the user;

extracting a keyword from said recognized instruction;

selecting an instructed program from said guide information of broadcast programs by retrieving an item data and retrieval history information including a retrieval frequency stored in a data storing section based on said extracted keyword;

obtaining retrieval history information when said instructed program is selected;

updating said retrieval history information including said retrieval frequency by adding said obtained retrieval history information to learn a user's favorite with said retrieval frequency; and displaying the instructed and selected program on a display.

15. The method according to claim 14, wherein the question is performed through the display.

16. The method according to claim 14, wherein the receiving is performed through a microphone.

17. The method according to claim 14, wherein the instruction is performed through a remote controller.

18. The method according to claim 14, further comprising the step of:

displaying the instructed and selected program on the display section when said keyword is a name of a program which is included in the guide information of television programs or in the retrieval history information stored in the data storing section.

19. The method according to claim 14, further comprising the step of:

displaying the instructed and selected program on the display section when said keyword is stored in said data storing section.

* * * * *